(12) United States Patent
Hunter

(10) Patent No.: US 11,536,615 B2
(45) Date of Patent: Dec. 27, 2022

(54) SENSE CIRCUIT WITH SAMPLE CAPACITORS AND SWITCH SET FOR ADJUSTABLE VOLTAGE SAMPLING

(71) Applicant: TEXAS INSTRUMENTS INCORPORATED, Dallas, TX (US)

(72) Inventor: Bradford Lawrence Hunter, Spicewood, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 31 days.

(21) Appl. No.: 17/095,800

(22) Filed: Nov. 12, 2020

(65) Prior Publication Data
US 2022/0146329 A1    May 12, 2022

(51) Int. Cl.
| | |
|---|---|
| H01C 7/00 | (2006.01) |
| G01K 7/24 | (2006.01) |
| H03K 5/24 | (2006.01) |
| H03M 1/12 | (2006.01) |

(52) U.S. Cl.
CPC ............ *G01K 7/24* (2013.01); *H01C 7/008* (2013.01); *H03K 5/24* (2013.01); *H03M 1/124* (2013.01)

(58) Field of Classification Search
None
See application file for complete search history.

(56) References Cited

U.S. PATENT DOCUMENTS

| 8,791,746 B1 * | 7/2014 | Cuadra | H02H 5/04 327/512 |
|---|---|---|---|
| 2012/0025802 A1 * | 2/2012 | Carmen | H02M 5/293 323/320 |

* cited by examiner

*Primary Examiner* — Erica S Lin
(74) *Attorney, Agent, or Firm* — Charles A. Brill; Frank D. Cimino

(57) ABSTRACT

An integrated circuit includes: a resistor terminal adapted to be coupled to a first end of a first resistor; a ground terminal adapted to be coupled to a second end of the first resistor; a second resistor in series with the first resistor and having a first end and a second end, the second end coupled to the resistor terminal; a first capacitor having a first capacitor terminal and a second capacitor terminal, the first capacitor terminal is coupled to: the first end of the second resistor via a first switch; and the ground terminal via a second switch; a second capacitor having a third capacitor terminal and a fourth capacitor terminal, the third capacitor terminal is coupled to: the first end of the second resistor via a third switch; the resistor terminal via a fourth switch; and the ground terminal via a fifth switch.

19 Claims, 5 Drawing Sheets

SENSE CIRCUIT WITH SAMPLE CAPACITORS AND SWITCH SET FOR ADJUSTABLE VOLTAGE SAMPLING

BACKGROUND

The proliferation of electronic devices and integrated circuit (IC) technology has resulted in the commercialization of IC products. As new electronic devices are developed and IC technology advances, new IC products are commercialized. One example IC product for electronic devices is a thermistor sense circuit. An example thermistor sense circuit includes a sense circuit to determine a sense voltage across the thermistor and an analog-to-digital converter (ADC) to convert the sense voltage to a digital value that can be correlated with a temperature value, an overtemperature fault condition, and/or an undertemperature fault condition. While use of an ADC is effective in a thermistor sense circuit, the ADC adds to the size and cost of the thermistor sense circuit. One of the challenges to designing a lower cost thermistor sense circuit is that different types of thermistors are available, including thermistors with a positive temperature coefficient (PTC) or a negative temperature coefficient (NTC). A thermistor with a PTC has a resistance that increases as temperature increases, and a thermistor with a NTC has a resistance that decreases as temperature increases. Efforts to reduce the cost of thermistor sense circuits, while maintaining compatibility with different thermistor types, are ongoing.

SUMMARY

In at least one example, an integrated circuit includes: a resistor terminal adapted to be coupled to a first end of a first resistor; a ground terminal adapted to be coupled to a second end of the first resistor; a second resistor in series with the first resistor and having a first end and a second end, the second end coupled to the resistor terminal a first capacitor having a first capacitor terminal and a second capacitor terminal. The integrated circuit also includes a set of switches including a first switch, a second switch, a third switch, a fourth switch, and a fifth switch. The first capacitor terminal is coupled to: the first end of the second resistor via the first switch; and the ground terminal via the second switch; a second capacitor having a third capacitor terminal and a fourth capacitor terminal, the third capacitor terminal is coupled to: the first end of the second resistor via the third switch; the resistor terminal via the fourth switch; and the ground terminal via the fifth switch; and a detection circuit coupled to the second capacitor terminal and the fourth capacitor terminal and configured to detect voltages from the first and second capacitors.

In another example, a system includes: a ground terminal; a resistor terminal; a first resistor having a first end coupled to the resistor terminal and a second end coupled to the ground terminal; a second resistor having a first end and a second end, the second end of the second resistor coupled to the resistor terminal; a first capacitor having a first capacitor terminal and a second capacitor terminal. The system also includes a set of switches including a first switch, a second switch, a third switch, a fourth switch, and a fifth switch. The first capacitor terminal is coupled to: the first end of the second resistor via a first switch; and the ground terminal via a second switch; a second capacitor having a third capacitor terminal and a fourth capacitor terminal, the third capacitor terminal is coupled to: the first end of the second resistor via a third switch; the resistor terminal via a fourth switch; and the ground terminal via a fifth switch; and a detection circuit coupled to the second capacitor terminal and the fourth capacitor terminal and configured to detect voltages from the first and second capacitors.

DETAILED DESCRIPTION

Figure 1:
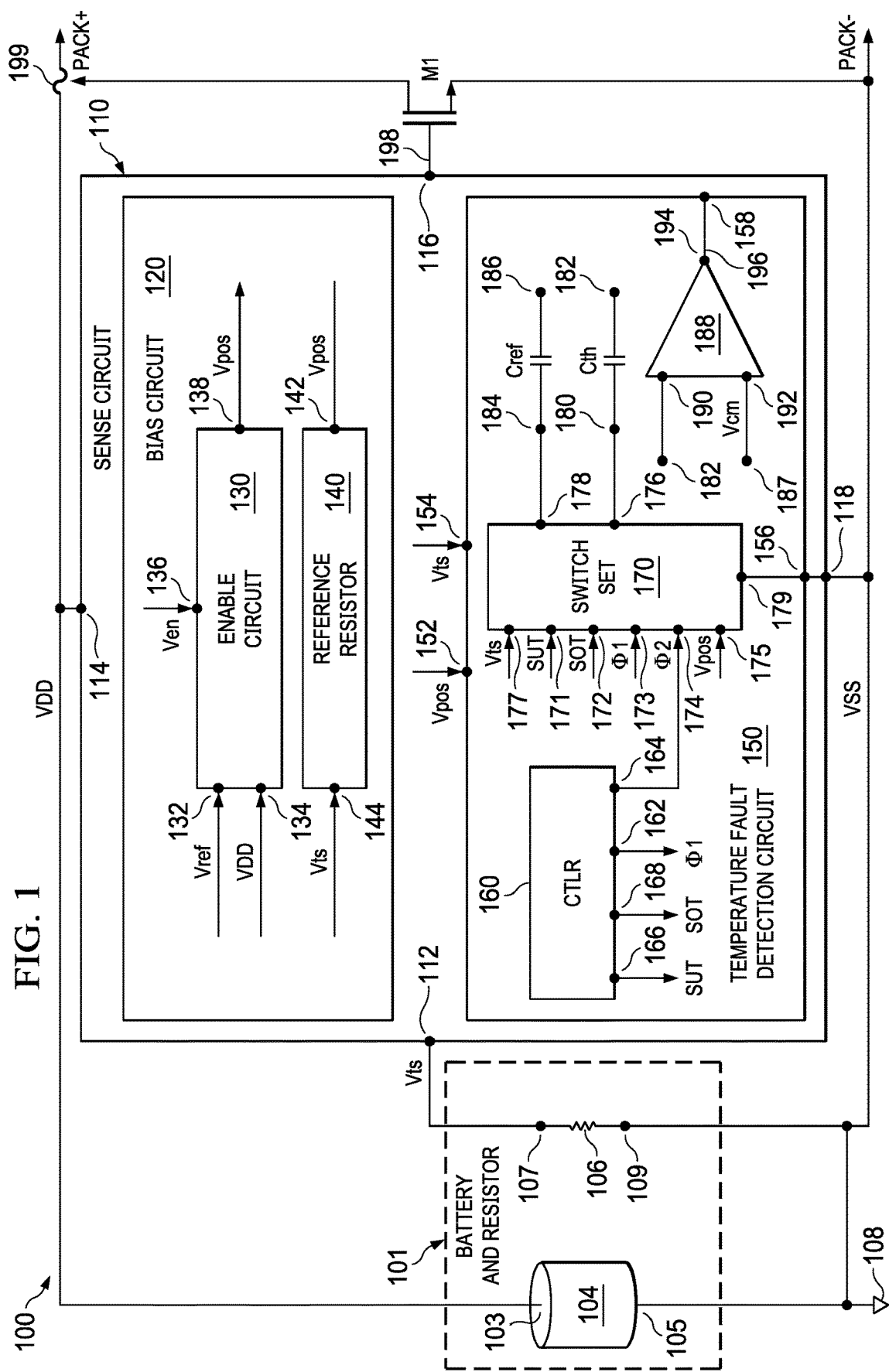
FIG. 1 is a block diagram of a system in accordance with an example embodiment.

FIG. 1 is a block diagram of a system 100 in accordance with an example embodiment. As shown, the system 100 includes a unit 101 that includes a battery 104 with a positive terminal 103 and a negative terminal 105. The unit 101 also includes a first resistor 106 with a first end 107 and a second end 109. In some example embodiments, the first resistor 106 is a thermistor. As used herein, a "thermistor" is a resistor whose resistance varies predictably as a function of temperature. In some example embodiments, the battery 104 and the thermistor 106 are separate rather than part of the unit 101. The system 100 also includes a sense circuit 110 coupled to the unit 101. More specifically, the sense circuit 110 includes a power supply input 114, a ground terminal 118, a resistor terminal 112, and a sense circuit output 116. As shown, the positive terminal 103 of the battery 104 is coupled to the power supply terminal 114 to provide a power supply voltage (VDD) to the sense circuit 110. Also, the negative terminal 105 of the battery 104 is coupled to ground 108 and the ground terminal 118 to provide a ground voltage (VSS) to the sense circuit 110. Also, the resistor terminal 112 is coupled to the first end 107 of the first resistor 106 and is configured to a receive a voltage (Vts) that varies as function of the resistance of the first resistor 106.

In the example of FIG. 1, the sense circuit 110 includes a bias circuit 120 having an enable circuit 130 and a second resistor 140 (labeled "reference resistor"). In some example embodiments, the second resistor 140 is trimmable and/or external to the sense circuit 110. More specifically, the enable circuit 130 includes: a first input 132 configured to receive a reference voltage (Vref) (e.g., from a reference voltage circuit); a second input 134 configured to receive VDD (e.g., from the power supply input 114); a third input 136 configured to receive an enable signal (Ven) (e.g., from the controller 160 or other Ven source); and an enable circuit output 138 equal to a sense voltage (Vpos), where Vpos is a function of Vref. As shown, Vpos is at the first end 142 of the second resistor 140, and Vts is at the second end 144 of the second resistor 140.

In the example of FIG. 1, the sense circuit 110 also includes a temperature fault detection circuit 150 with a first input 152 configured to receive Vpos, a second input 154 configured to receive Vts, a ground input 156 configured to receive VSS, and a temperature fault detection circuit output 158. In the example of FIG. 1, the temperature fault detection circuit includes a controller 160 having a first controller output 162, a second controller output 164, a third controller output 166, and a fourth controller output 168. The first controller output 162 is configured to provide a first control signal (01), the second controller output 164 is configured to provide a second control signal (02), the third controller output 166 is configured to provide a third control signal (SUT), and the fourth controller output 168 is configured to provide a fourth signal (SOT).

As shown, the temperature fault detection circuit 150 also includes a switch set 170 coupled to the controller 160, the first input 152, the second input 154, and the ground input 156. More specifically, the switch set 170 includes: a first switch set input 171 configured to receive SUT from the third controller output 166, a second switch set input 172 configured to receive SOT from the fourth controller output 168, a third switch set input 173 configured to receive φ1 from the first controller output 162, a fourth switch set input 174 configured to receive φ2 from the second controller output 164, a fifth switch set input 175 configured to receive Vpos from the first input 152, a sixth switch set input 177 configured to receive Vts from the second input 154, and a seventh switch set input 179 configured to receive VSS from the ground input 156. The switch set 170 also includes a first switch set output 176 and a second switch set output 178.

In the example of FIG. 1, the temperature fault detection circuit 150 also includes: a first capacitor (Cref) with a first Cref terminal 184 and a second Cref terminal 186; a second capacitor (Cth) with a first Cth terminal 180 and a second Cth terminal 182; and a switched comparator 188 with a first comparator input 190, a second comparator input 192, and a comparator output 194. In the example of FIG. 1, the first Cth terminal 180 is coupled to the first switch set output 176, and the second Cth terminal 182 is coupled to the first comparator input 190. Also, the first Cref terminal 184 is coupled to the second switch set output 178. In the example of FIG. 1, the second Cref terminal 186 is coupled to the first comparator input 190 or the second Cth terminal 192. Also, the second comparator input 192 is configured to receive a reference voltage (Vcm).

In some example embodiments, the switched comparator 188 is configured to provide a signal 196 at the comparator output 194 when a ratio of Vpos and one of (Vpos-Vts) or (Vts-Vss) is above an upper threshold or below a lower threshold. The signal 196, for example, is provided to the fault detection circuit output 158. The signal 196 is received by the sense circuit 110 or another downstream controller to detect an overtemperature or undertemperature fault condition and to respond accordingly. In one example embodiment, the signal 196 results in a control signal 198 at the sense circuit output 116 for one or more components of the system 100.

In the example of the FIG. 1, the sense circuit output 116 (or downstream controller) is coupled to the control terminal of a transistor (M1). Also, the current terminals of M1 are coupled between a fuse 199 and the ground 108. In the example of FIG. 1, the signal 196 from the switched comparator 188 is configured to signal an overtemperature fault condition or undertemperature fault condition (e.g., when interpreted by a downstream controller) that connects terminals of the fuse 199 to the ground 108. The result is an open circuit in the system 100. In other example embodiments, M1 and/or the fuse 199 are not used. In such examples, the signal 196 from the switched comparator 188 indicates an overtemperature fault condition or undertemperature fault condition (e.g., when interpreted by a downstream controller). Subsequently, a downstream controller recognizes the temperature fault condition and responds as appropriate. In some example embodiments, the system 100 is a battery pack. In other example embodiments, the system 100 is a battery-powered electronic device.

Figure 2:
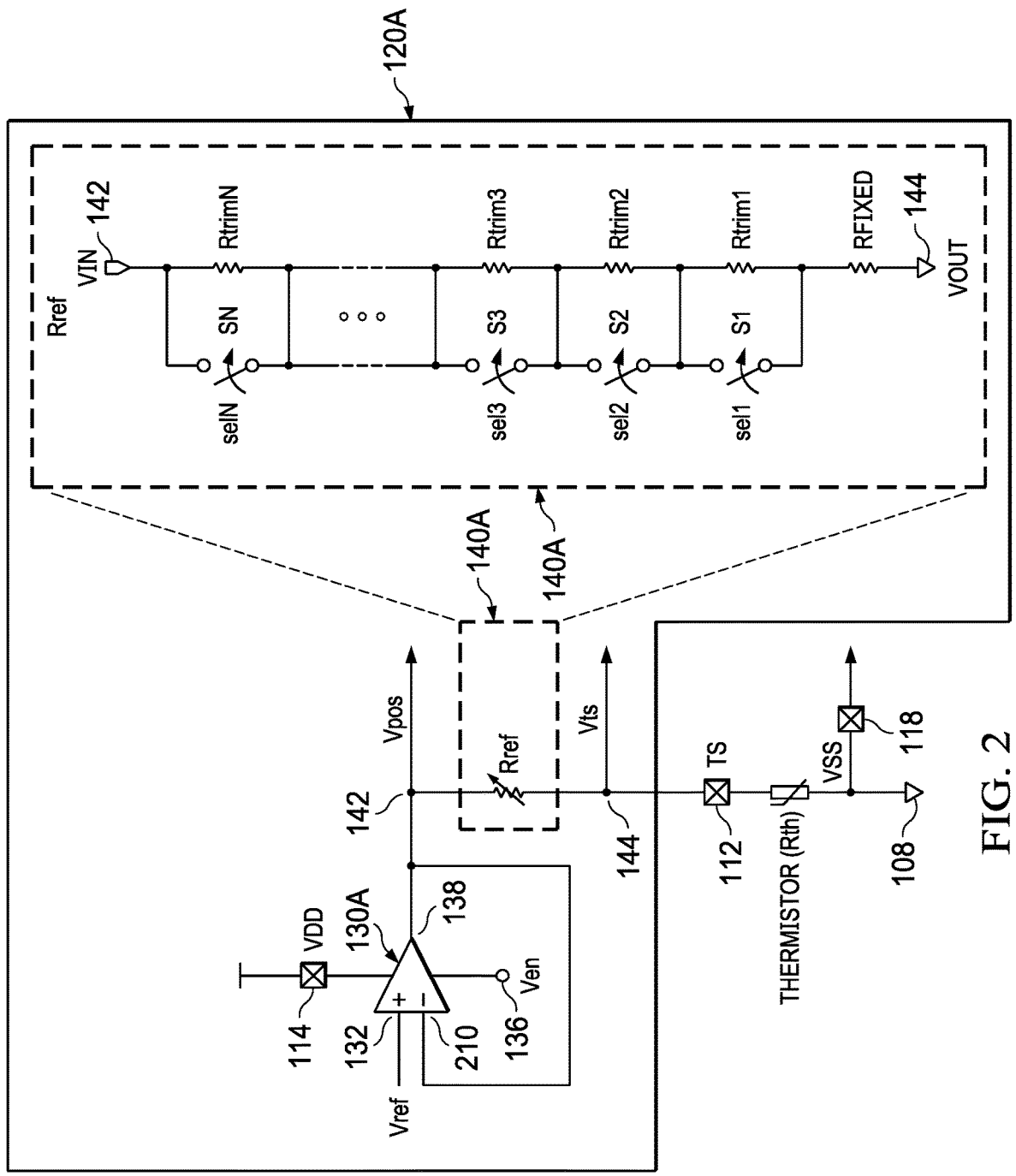
FIG. 2 is a schematic diagram of a bias circuit for a thermistor sense circuit in accordance with an example embodiment.

FIG. 2 is a bias circuit 120A (an example of the bias circuit 120 in FIG. 1) for a sense circuit (e.g., the sense circuit 110 in FIG. 1) in accordance with an example embodiment. As shown, the bias circuit 120A is coupled to a resistor or thermistor (Rth) (an example of first resistor 106 in FIG. 1). Also, Rth is coupled to the resistor terminal 112 and the ground terminal 118 is coupled to ground 108. As shown, the bias circuit 120A includes an enable circuit 130A (an example of the enable circuit 130 in FIG. 1) in the form of an operational amplifier with a first (non-inverting) input 132 configured to receive Vref and with a second (inverting) input 210. In FIG. 2, the operational amplifier is powered by VDD provided by the power supply terminal 114. Also, the operational amplifier is enabled responsive to Ven provided by the third input 136. The enable circuit output 138 is coupled to the first end 142 of a second resistor (Rref) 140A (an example of the second resistor 140 in FIG. 1). In the example of FIG. 2, the second resistor 140A is a trimmable resistor. As shown, the second resistor 140A includes resistors (Rfixed, Rtim-RtrimN) in series between the first end 142 and the second end 144 of the second resistor 140A. The second resistor 140A also includes switches S1-SN. Each of S1-SN is in parallel with a different one of Rtrim-RtrimN to selectively bypass the respective Rtrim-RtrimN responsive to control signals sel1-selN. In this manner, the value of the second resistor 140A is adjustable to improve accuracy of a sense circuit and related operations. With the bias circuit 120A, Vpos is a function of Vref. Also, the bias circuit 120A enables sensing operations to be performed only periodically when Ven is asserted to reduce power consumption of sensing operations for a system (e.g., the system 100 in FIG. 1).

Figure 3:
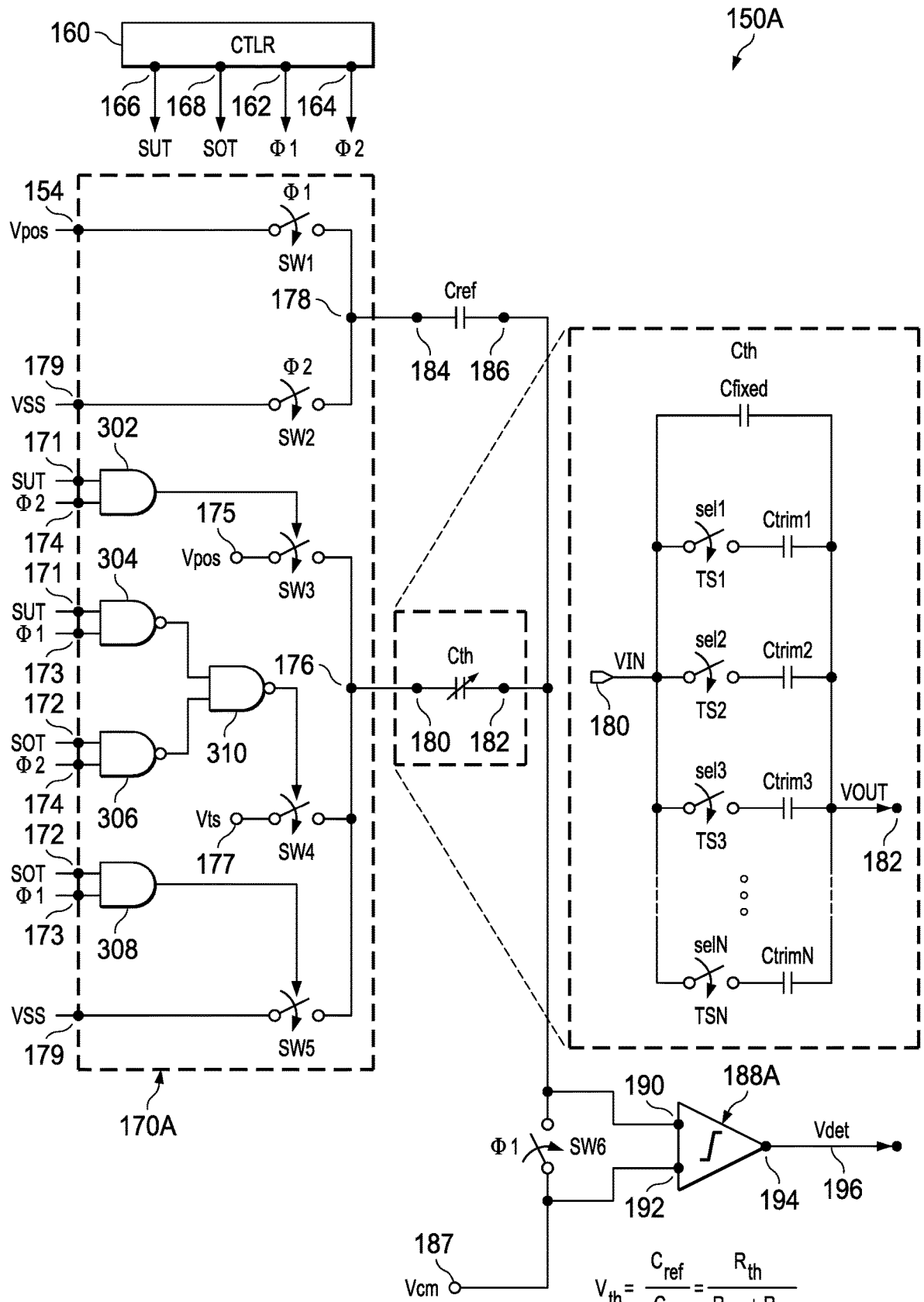
FIG. 3 is a schematic diagram of a temperature fault detection circuit in accordance with an example embodiment.

FIG. 3 is a temperature fault detection circuit 150A (an example of the temperature fault detection circuit 150 in FIG. 1) for a sense circuit (e.g., the sense circuit 110 in FIG. 1) in accordance with an example embodiment. As shown, the temperature fault detection circuit 150A includes the controller 160 and related outputs 162, 164, 166, 168 to provide φ1, φ2, SUT, and SOT. The temperature fault detection circuit 150A also includes Cref, Cth, and a switched comparator 188A (an example of the switched comparator 188 in FIG. 1). For the switched comparator 188A, a switch SW6 is between the first and second comparator inputs 190 and 192, where SW6 is responsive to φ1.

In the example of FIG. 3, the temperature fault detection circuit 150A also includes a switch set 170A (an example of the switch set 170 in FIG. 1). In operation, the switch set 170A couples Vpos or Vss to the first Cref terminal 184 responsive to φ1 and φ2. Also, the switch set 170A couples Vpos, Vts, or Vss to the first Cth terminal 180 responsive to φ1, 02, SUT, and SOT. More specifically, the switch set 170A includes the switch set inputs 171, 172, 173, 174, 175, 177, and 179. As shown, the first switch set input 171 is configured to receive SUT (e.g., from the third controller output 166). The second switch set input 172 is configured to receive SOT (e.g., from the fourth controller output 168). The third switch set input 173 is configured to receive φ1 (e.g., from the first controller output 162). The fourth switch set input 174 is configured to receive φ2 (e.g., from the second controller output 164). The fifth switch set input 175 is configured to receive Vpos (e.g., from the first end 142 of the second resistor, such as the reference resistor 140 in FIG.

1 or Rref in FIG. 2). The sixth switch set input 177 is configured to receive Vts (e.g., from the resistor terminal 112 in FIG. 1). The seventh switch set input 179 is configured to receive VSS from a ground (e.g., the ground terminal 118 in FIGS. 1 and 2).

The switch set 170A also includes the first switch set output 176 and the second switch set output 178. The first switch set output 176 is coupled to the first Cth terminal 180. Also, the second switch set output 178 is coupled to the first Cref terminal 184. In the example of FIG. 3, the second Cth terminal 182 and the second Cref terminal 186 are coupled to the first comparator input 190. In some example embodiments, the second comparator input 192 is coupled to a reference voltage source (e.g., Vcm source) 187. In the example of FIG. 3, Cth is trimmable. As shown, Cth includes parallel capacitors (Cfixed and Ctrim1-CtrimN) between the first Cth terminal 180 and the second Cth terminal 182. In operation, switches TS1-TSN selectively add Ctrim1-CtrimN in parallel with Cfixed responsive to control signals sel1-selN.

In operation, the switch set 170A is configured to provide Vpos or VSS to the first Cref terminal 184 responsive to φ1 and φ2. Also, the switch set 170A is configured to provide Vpos, Vts, or VSS to the first Cth terminal 180 responsive to SUT, SOT, 01, and φ2. In the example embodiment of FIG. 3, the switch set 170A includes a set of switches SW1-SW5. In some example embodiments, SW1 is responsive to φ1, SW2 is responsive φ2, SW3 is responsive to SUT and φ2, SW4 is responsive to SUT, φ1, SOT, and φ2, and SW5 is responsive to SOT and φ1. In some example embodiments, the switch set 170A includes various gates including AND gates 302 and 308, and NAND gates 304, 306, and 310. More specifically, the inputs to the AND gate 302 are SUT and φ2, the inputs to the NAND gate 304 are SUT and φ1, the inputs to the NAND gate 306 are SOT and φ2, the inputs to the AND gate 308 are SOT and φ1, and the inputs to the NAND gate 310 are the outputs of NAND gates 304 and 306. With the temperature fault detection circuit 150A, the voltage (Vth) across the first resistor is given as:

$$V_{th} \propto \frac{C_{ref}}{C_{th}} = \frac{R_{th}}{R_{ref} + R_{th}}.$$  Equation (1)

In equation (1), Vth is the voltage across the first resistor 106 (e.g., Rth in FIG. 2), Cref is the capacitance of Cref, Cth is the capacitance of Cth, Rth is the resistance of the first resistor 106, and Rref is the resistance of the second resistor 140 (the reference resistor in FIG. 1 or Rref in FIG. 2). In some example embodiments, a detection technique for temperature fault detection is ratiometric and based on the ratio of two quantities $$\left(e.g., \frac{C_{ref}}{C_{th}} \text{ or } \frac{R_{th}}{R_{ref} + R_{th}}\right).$$

In operation, the temperature fault detection circuit 150A is able to detect when an under threshold condition and over threshold condition occurs for the switched comparator 188A. In some example embodiments, the switched comparator 188A outputs a signal indicating an under threshold condition if the difference between Vcm at the second comparator input 192 and the voltage at the first comparator input 190 is under a lower threshold. Also, in some example embodiments, the switched comparator 188A outputs a signal indicating an over threshold condition if the difference between Vcm at the second comparator input 192 and the voltage at the first comparator input 190 is above an upper threshold. By trimming Cth, the thresholds that trigger an over threshold condition and/or an under threshold condition and related overtemperature and undertemperature fault conditions are adjustable. In one example, Cref has a fixed value on the order of hundreds of femtofarads (e.g., 100 fF), and Cth is on the order of several picofarads (e.g., 2 pF). Also, in some example embodiments, Cth is trimmable up or down by several hundred femtofarads in steps of tens of femtofarads. In one example, Cfixed is 1.5 pF and each Ctrim adds tens of femtofarads. In other examples, the values of Cref and Cth vary.

In the example of FIG. 3, the temperature fault detection circuit 150A and related components are represented as if part of a single-ended solution. In practice, differential signaling and related components may be used for temperature fault detection operations. An example differential signaling scenario would have four comparator inputs, two Cref, two Cth, and two of the switch set 170A In one example embodiment, a first pair of Cref and Cth are a positive capacitor pair (Cref+ and Cth+) while a second pair of Cref and Cth are a negative capacitor pair (Cref− and Cth−), where Cref+ and Cth+ switch in the opposite polarity relative to Cref− and Cth−. In some example embodiments, one input of the comparator is coupled to second terminals of Cref+ and Cth+ while another input of the comparator is coupled to second terminals of Cref− and Cth−. For more information regarding the physical structure of a differential comparator with fully differential capacitor pairs, U.S. Pat. No. 8,134,401 is incorporated herein by reference. Regardless of the particular detection circuit and sampling components used, a sense circuit is able to obtain voltage samples at different ends of resistors in series. Such voltage samples enable analysis of resistivity or related parameters.

With a fully differential sensing circuit, power supply noise rejection is improved. Also, in some example embodiments, a temperature fault detection circuit as described herein is ratiometric such that temperature fault sensing is insensitive to Vpos. Accordingly, if Vpos were to increase by 10%, the upper threshold (Vth+ and Vth−) would increase proportionally so that the accuracy in not affected. With the example of FIG. 3, trimming Cth ensures that detection of an undertemperature fault condition and/or detection of an overtemperature fault condition is accurate with limited components (e.g., one switched comparator and a trimmable sample capacitor). This solution is much simpler than having multiple comparators, multiple trimmable capacitors, and/or an analog-to-digital converter (ADC). In the example of FIG. 3, the temperature fault detection circuit 150A is sensitive to the ratio of Vts to Vpos. In order to account for this sensitivity, different sample and measurement intervals are possible as described for FIG. 5.

Figure 4:
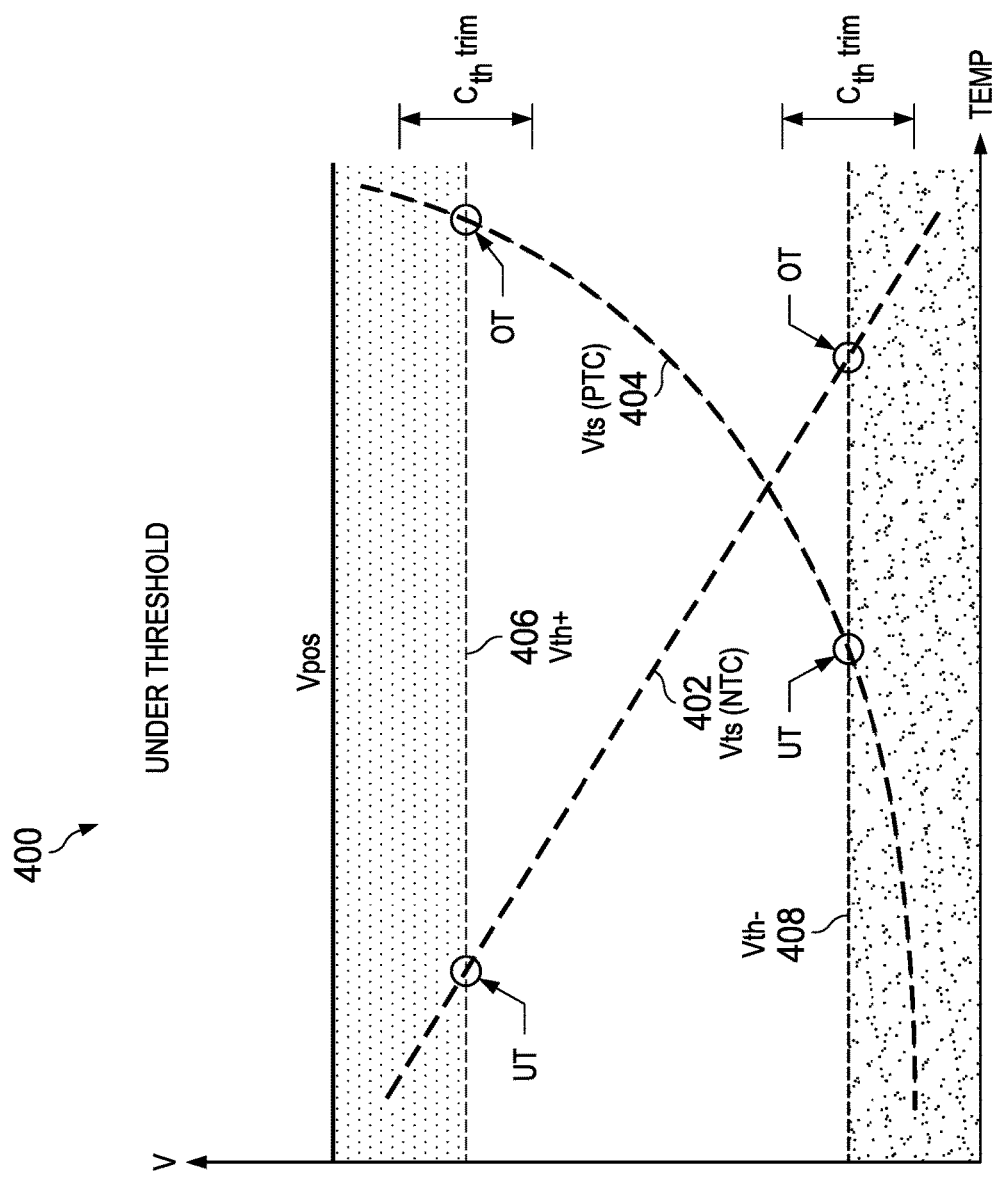
FIG. 4 is a graph of under temperature and over temperature fault detection based on comparator thresholds in accordance with an example embodiment.

FIG. 4 is a graph 400 of under temperature and over temperature fault detection based on comparator thresholds in accordance with an example embodiment. Graph 400 shows two Vts lines 402 and 404. The Vts line 402 is due to a thermistor with a negative temperature coefficient (NTC) and the Vts line 404 is due to a thermistor with a positive temperature coefficient (PTC). As shown, the Vts line 402 crosses an upper threshold (Vth+) 406 responsive to an undertemperature fault condition, and crosses a lower threshold (Vth−) 408 responsive to an overtemperature fault condition. In contrast, the Vts line 404 crosses the upper threshold 406 responsive to an overtemperature fault condition, and crosses the lower threshold 408 responsive to an undertemperature fault condition. In graph 400, an example Cth trim range is represented. Adjustments to the upper threshold 406 and/or the lower threshold 408 of Cth are possible to adjust fault detection as desired.

Figure 5:
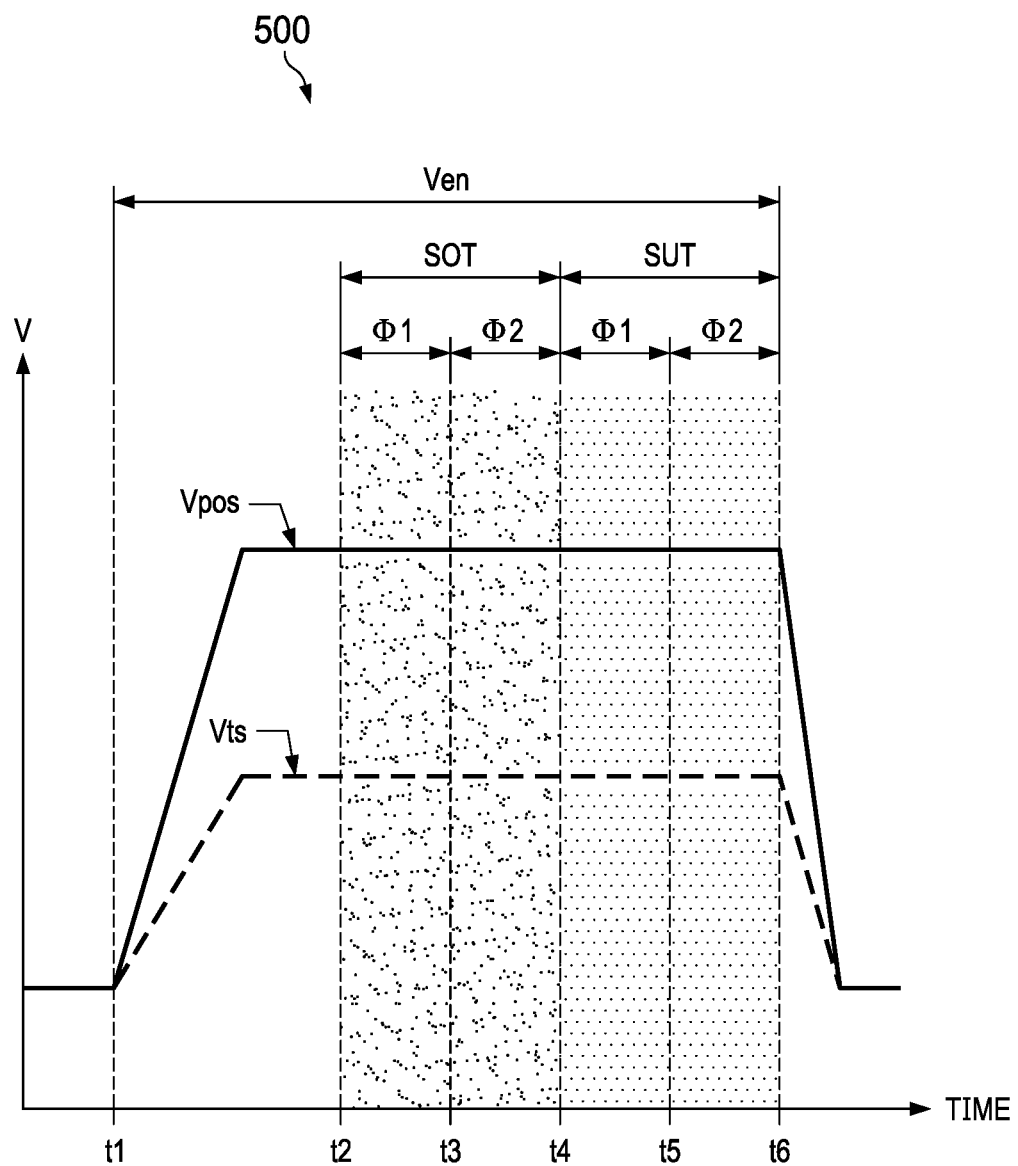
FIG. 5 is a timing diagram of thermistor sense circuit voltages and measurement intervals in accordance with an example embodiment.

FIG. 5 is a timing diagram 500 of sense circuit voltages and measurement intervals in accordance with an example embodiment. In the timing diagram 500, voltage as a function of time is represented along with the control signals of FIGS. 1 and 3. More specifically, the timing diagram 500 shows examples of Vpos and Vts during a sensing interval (when Ven is asserted). As shown, Vpos and Vts initially are low at time t1. Between t1 and time t2, Vpos and Vts rise and settle. At time t2 to time t3, an over threshold sample phase is performed responsive to SOT and φ1. At time t3 to time t4, an over threshold measurement phase is performed responsive to SOT and φ2. At time t4 to time t5, an under threshold sample phase is performed responsive to SUT and φ1. At time t5 to time t6, an under threshold measurement phase is performed responsive to SUT and φ2. After time t6, Ven is deasserted and sensing operations are not performed until Ven is again asserted. As desired, over threshold sampling and related detection and/or under threshold sampling and related detection are performed by a sense circuit.

In some example embodiments, the described sense circuit and related IC enable sense operations while avoiding a large and costly analog-to-digital converter (ADC) on the IC. Also, in some example embodiments, a single switched comparator with upper and lower thresholds is configured to output an upper threshold crossed signal responsive to the upper threshold of the switched comparator being crossed. Also, a single switched comparator with upper and lower thresholds is configured to output a lower threshold crossed signal responsive to the lower threshold of the switched comparator being crossed. In some example embodiments, the second resistor is trimmable to adjust its value within a predetermined range and trim granularity. Also, in some example embodiments, the second capacitor is trimmable to adjust its value within a predetermined range and trim granularity. By trimming the second resistor and the second capacitor, accurate temperature fault detection or other sense operations are possible. More specifically, the sense operations involve comparing an input with an upper threshold, comparing a lower threshold of the switched comparator to detect a temperature fault detection, and/or other sense operations. The benefit of the described sense circuit and related IC operations is that complexity and cost of a sense circuit is reduced.

In some example embodiments, a system (e.g., a battery pack or battery-powered electronic device) includes a circuit (e.g., an integrated circuit and an internal or external first resistor 106 or Rth) having a ground terminal (e.g., the ground terminal 118 in FIGS. 1 and 2); a resistor terminal (e.g., the resistor terminals 112 in FIGS. 1 and 2); a first resistor (e.g., the first resistor 106 in FIG. 1, or Rth in FIG. 2) having a first end (e.g., the first end 107 in FIG. 1) coupled to the resistor terminal and a second end (e.g., the second end 109 in FIG. 1) coupled to the ground terminal; a second resistor (e.g., the second resistor 140 in FIG. 1, or Rref in FIG. 2) having a first end (e.g., the first end 142 in FIGS. 1 and 2) and a second end (e.g., the second end 144 in FIGS. 1 and 2), the second end of the second resistor coupled to the resistor terminal; a first capacitor (e.g., Cref in FIGS. 1 and 2) having a first capacitor terminal (e.g., the first Cref terminal 184 in FIGS. 1 and 3) and a second capacitor terminal (e.g., the second Cref terminal 186 in FIGS. 1 and 3), the first capacitor terminal is coupled to: the first end of the second resistor (e.g., the first end 142 of the second resistor 140 in FIG. 1, or Rref in FIG. 2) via a first switch (e.g., SW1 in FIG. 3); and the ground terminal (e.g., the ground terminal 118 in FIGS. 1 and 2) via a second switch (e.g., SW2 in FIG. 3); a second capacitor (e.g., Cth in FIGS. 1 and 3) having a third capacitor terminal (e.g., the first Cth terminal 180 in FIGS. 1 and 3) and a fourth capacitor terminal (e.g., the second Cth terminal 182 in FIGS. 1 and 3), the third capacitor terminal is coupled to: the first end of the second resistor via a third switch (e.g., SW3 in FIG. 3); the resistor terminal (e.g., the resistor terminal 112 in FIGS. 1 and 2) via a fourth switch (e.g., SW4 in FIG. 3); and the ground terminal (e.g., the ground terminal 118 in FIGS. 1 and 2) via a fifth switch (e.g., SW5 in FIG. 3); and a detection circuit (e.g., the switched comparator 188 in FIG. 1, the switched comparator 188A in FIG. 3, or ADCs) coupled to the second capacitor terminal (e.g., the second Cref terminal 186 in FIGS. 1 and 3) and the fourth capacitor terminal (e.g., the second Cth terminal 182 in FIGS. 1 and 3) and configured to detect voltages from the first and second capacitors.

In some example embodiments, the first resistor (e.g., the first resistor 106 in FIG. 1, or Rth in FIG. 2) is a thermistor, and the detection circuit is configured to provide an output signal (e.g., the signal 196, or the signal 198) the identifying a temperature or temperature fault condition responsive to the voltages from the first and second capacitors. In some example embodiments, the detection circuit includes a switched comparator (e.g., the switched comparator 188 in FIG. 1, or the switched comparator 188A in FIG. 3) having a first comparator input (e.g., the first comparator input 190 in FIGS. 1 and 3), a second comparator input (e.g., the second comparator input 192 in FIGS. 1 and 3) and a comparator output (e.g., the comparator output 194 in FIGS. 1 and 3), the first comparator input is coupled to the second and fourth capacitor terminals, the second comparator input is configured to receive a reference voltage (e.g., Vcm in FIGS. 1 and 3), and the switched comparator is configured to assert an output signal (e.g., the signal 196 in FIGS. 1 and 3) at the comparator output responsive to a voltage at the first comparator input and the reference voltage.

In some example embodiments, the switched comparator is configured to: assert a first output signal as the output signal (e.g., the signal 196 in FIGS. 1 and 3) at the comparator output responsive to a ratio of the voltage at the first comparator input and the reference voltage being greater than an upper threshold (e.g., Vth+ 406 in FIG. 4); and assert a second output signal as the output signal (e.g., the signal 196 in FIGS. 1 and 3) at the comparator output responsive to the ratio of the voltage at the first comparator input and the reference voltage being less than a lower threshold (e.g., Vth− 408 in FIG. 4). In some example embodiments, the voltage at the first comparator input is a positive differential signal sampled though a positive capacitor pair (e.g., Cref+ and Cth+), and the voltage at the second comparator input is a negative differential signal sampled though a negative capacitor pair (e.g., Cref− and Cth−).

In some example embodiments, the system includes a controller (e.g., the controller 160 in FIGS. 1 and 3) configured to provide control signals (e.g., φ1, φ2, SUT, and SOT in FIGS. 1 and 3) to control the first, second, third, fourth, and fifth switches (e.g., S1-S5 in FIG. 3), wherein the control signals operate to: close only one of the first or second switches (e.g., one of S1 and S2) at a time; and close only one of the third, fourth, or fifth switches (e.g., one of SW3, SW4, and SW5) at a time. In some example embodiments, the first switch is controlled responsive to a first control signal (e.g., φ1 in FIGS. 1 and 3) of the control signals, the second switch is controlled responsive to a second control signal (e.g., φ2 in FIGS. 1 and 3) of the control signals, the third switch is controlled responsive to the second control signal and a third control signal (e.g., SUT in FIGS. 1 and 3) of the control signals, the fourth switch is controlled responsive to the first control signal, the second control signal, the third control signal, and a fourth control signal (e.g., SOT in FIGS. 1 and 3) of the control signals, and the fifth switch is controlled responsive to the first control signal and the fourth control signal.

In some example embodiments, the detection circuit includes a switched comparator (e.g., the switched comparator 188 in FIG. 1, or the switched comparator 188A in FIG. 3) having a first comparator input (e.g., the first comparator input 190 in FIGS. 1 and 3), a second comparator input (e.g., the second comparator input 192 in FIGS. 1 and 3), a comparator output (e.g., the comparator output 194 in FIGS. 1 and 3), and a sixth switch (e.g., SW6 in FIG. 3) between the first and second comparator inputs, the first comparator input is coupled to the second and fourth capacitor terminals (e.g., the second Cref terminal 186 and the second Cth terminal 182 in FIGS. 1 and 3), the second comparator input is configured to receive a reference voltage (e.g., Vcm in FIGS. 1 and 3), the sixth switch controlled responsive to the first control signal (e.g., 01 in FIGS. 1 and 3), and the switched comparator is configured to assert an output signal (e.g., signal 196 in FIGS. 1 and 3) at the comparator output responsive to a voltage at the first comparator input and the reference voltage. In some example embodiments, the first capacitor and the second capacitor are a positive capacitor pair (Cref+ and Cth+), the system comprises a third capacitor and a fourth capacitor as a negative sampling pair (Cref− and Cth−), and the switched comparator and sampling operations are fully differential.

In some example embodiments, the system comprises an integrated circuit having the second resistor (e.g., the second resistor 140 in FIG. 1, or Rref in FIG. 2), the first capacitor (e.g., Cref in FIGS. 1 and 3) and the second capacitor (e.g., Cth in FIGS. 1 and 3), the second resistor being trimmable, and the second capacitor being trimmable. In some example embodiments, the system includes a battery (e.g., the battery 104 in FIG. 1); and an enable circuit (e.g., the enable circuit 130 in FIG. 1) coupled between the battery and the first end of the second resistor (e.g., the first end 142 of the second resistor 140 in FIG. 1, or the first end 142 of Rref in FIG. 2). In some example embodiments, the first and second resistors are external to the sense circuit or related IC. In other example embodiments, the first and second resistors are part of with the sense circuit or related IC.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Modifications are possible in the described embodiments, and other embodiments are possible, within the scope of the claims.

What is claimed is:

1. An integrated circuit, comprising:
   a resistor coupled between a voltage terminal and a resistor terminal;
   a first capacitor having a first capacitor terminal and a second capacitor terminal;
   a second capacitor having a third capacitor terminal and a fourth capacitor terminal;
   a first switch coupled between the voltage terminal and the first capacitor terminal;
   a second switch coupled between a ground terminal and the first capacitor terminal;
   a third switch coupled between the voltage terminal and the third capacitor terminal;
   a fourth switch coupled between the resister terminal and the third capacitor terminal;
   a fifth switch coupled between the ground terminal and the third capacitor terminal; and
   a comparator having a comparator output and first and second comparator inputs, the first comparator input coupled to the second capacitor terminal and the fourth capacitor terminal.

2. The integrated circuit of claim 1, wherein the comparator is configured to provide an output signal at the comparator output indicating a temperature or a temperature fault condition responsive to a first voltage at the first comparator input and a second voltage at the second comparator input.

3. The integrated circuit of claim 1, further comprising a voltage generator having an output coupled to the voltage terminal.

4. The integrated circuit of claim 2, wherein:
   the comparator is configured to provide the output signal indicating an under temperature fault condition responsive to a first ratio between the first voltage and the second voltage being below a first threshold; and
   the comparator is configured to provide the output signal indicating an over temperature fault condition responsive to a second ratio between the first voltage and the second voltage being above a second threshold, the second threshold being above the first threshold.

5. The integrated circuit of claim 1, wherein:
   the first switch has a first control terminal;
   the second switch has a second control terminal;
   the third switch has a third control terminal;
   the fourth switch has a fourth control terminal;
   the fifth switch has a fifth control terminal; and
   the integrated circuit further includes a controller having first, second, third, fourth, and fifth control outputs coupled to the respective first, second, third, fourth, and fifth control terminals, the controller configured to:
   in a sample phase, provide first control signals at the first through fifth control outputs to: enable the first switch; disable the second switch; and enable one of the third through fifth switches; and
   in a measurement phase, provide second control signals at the first through fifth control outputs to: enable the second switch; disable the first switch; and
   enable another one of the third through fifth switches.

6. The integrated circuit of claim 5, wherein the controller is configured to:
   in the sample phase, provide the first control signals at the first through fifth control outputs to enable the fifth switch; and in the measurement phase, provide the second control signals at the first through fifth control outputs to enable the third switch; and wherein the comparator is configured to provide an output signal at the comparator output indicating an over temperature condition responsive to a first voltage at the first comparator input and a second voltage at the second comparator input.

7. The integrated circuit of claim 5, wherein the controller is configured to:
in the sample phase, provide the first control signals at the first through fifth control outputs to enable the fourth switch; and
in the measurement phase, provide the second control signals at the first through fifth control outputs to enable the third switch; and
wherein the comparator is configured to provide an output signal at the comparator output indicating an under temperature condition responsive to a first voltage at the first comparator input and a second voltage at the second comparator input.

8. The integrated circuit of claim 7, wherein:
the first through fifth switches are part of a first switch set;
the integrated circuit further includes a third capacitor having fifth and sixth capacitor terminals, a fourth capacitor having seventh and eighth capacitor terminals, and a second switch set having switch inputs and first and second switch outputs, the switch inputs coupled to the voltage terminal, the resistor terminal, and the ground terminal, the first switch output coupled to the fifth capacitor terminal, and the second switch output coupled to the seventh capacitor terminal; and
the second comparator input is coupled to the sixth and eighth capacitor terminals.

9. The integrated circuit of claim 1, wherein the second resistor is a trimmable resistor.

10. The integrated circuit of claim 1, wherein the second capacitor is a trimmable capacitor.

11. A system, comprising:
a first resistor coupled between a resistor terminal and a ground terminal;
a second resistor coupled between a voltage terminal and the resistor terminal;
a first capacitor having a first capacitor terminal and a second capacitor terminal;
a second capacitor having a third capacitor terminal and a fourth capacitor terminal;
a first switch coupled between the voltage terminal and the first capacitor terminal;
a second switch coupled between the ground terminal and the first capacitor terminal;
a third switch coupled between the voltage terminal and the third capacitor terminal;
a fourth switch coupled between the resister terminal and the third capacitor terminal;
a fifth switch coupled between the ground terminal and the third capacitor terminal; and
a comparator having a comparator output and first and second comparator inputs, the first comparator input coupled to the second and fourth capacitor terminals.

12. The system of claim 11, wherein the first resistor is a thermistor, and the comparator is configured to provide an output signal identifying a temperature or temperature fault condition responsive to a first voltage at the first comparator input and a second voltage at the second comparator input.

13. The system of claim 11, further comprising a voltage generator having an output coupled to the voltage terminal.

14. The system of claim 12, wherein:
the comparator is configured to provide the output signal indicating an under temperature fault condition responsive to a first ratio between the first voltage and the second voltage being below a first threshold; and
the comparator is configured to provide the output signal indicating an over temperature fault condition responsive to a second ratio between the first voltage and the second voltage being above a second threshold, the second threshold being above the first threshold.

15. The system of claim 11, wherein:
the first switch has a first control terminal;
the second switch has a second control terminal;
the third switch has a third control terminal;
the fourth switch has a fourth control terminal;
the fifth switch has a fifth control terminal; and
the system further includes a controller having first, second, third, fourth, and fifth control outputs coupled to the respective first, second, third, fourth, and fifth control terminals, the controller configured to:
in a sample phase, provide first control signals at the first through fifth control outputs to: enable the first switch; disable the second switch; and enable one of the third through fifth switches; and
in a measurement phase, provide second control signals at the first through fifth control outputs to: enable the second switch; disable the first switch; and enable another one of the third through fifth switches.

16. The system of claim 15, wherein the controller is configured to:
in the sample phase, provide the first control signals at the first through fifth control outputs to enable the fifth switch; and
in the measurement phase, provide the second control signals at the first through fifth control outputs to enable the third switch; and
wherein the comparator is configured to provide an output signal at the comparator output indicating an over temperature condition responsive to a first voltage at the first comparator input and a second voltage at the second comparator input.

17. The system of claim 15, wherein the controller is configured to:
in the sample phase, provide the first control signals at the first through fifth control outputs to enable the fourth switch; and
in the measurement phase, provide the second control signals at the first through fifth control outputs to enable the third switch; and
wherein the comparator is configured to provide an output signal at the comparator output indicating an under temperature condition responsive to a first voltage at the first comparator input and a second voltage at the second comparator input.

18. The system of claim 17, wherein:
the first through fifth switches are part of a first switch set;
the system further includes a third capacitor having fifth and sixth capacitor terminals, a fourth capacitor having seventh and eighth capacitor terminals, and a second switch set having switch inputs and first and second switch outputs, the switch inputs coupled to the voltage terminal, the resistor terminal, and the ground terminal, the first switch output coupled to the fifth capacitor terminal, and the second switch output coupled to the seventh capacitor terminal; and the second comparator input is coupled to the sixth and eighth capacitor terminals.

19. The system of claim 11, wherein the system comprises an integrated circuit having the second resistor, the first capacitor and the second capacitor, the second resistor being trimmable, and the second capacitor being trimmable.

* * * * *